US008520455B2

(12) United States Patent
Ross et al.

(10) Patent No.: US 8,520,455 B2
(45) Date of Patent: Aug. 27, 2013

(54) METHOD AND APPARATUS FOR TRAINING A DLL IN A MEMORY SUBSYSTEM

(75) Inventors: Diarmuid P. Ross, Mountain View, CA (US); Douglas C. Lee, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 80 days.

(21) Appl. No.: 13/347,175

(22) Filed: Jan. 10, 2012

(65) Prior Publication Data

US 2013/0176787 A1 Jul. 11, 2013

(51) Int. Cl.
*G11C 7/00* (2006.01)
(52) U.S. Cl.
USPC ............... 365/193; 365/185.18; 365/194
(58) Field of Classification Search
USPC .................. 365/233.14, 233.16, 233.17
See application file for complete search history.

(56) References Cited

U.S. PATENT DOCUMENTS

| | | | |
|---|---|---|---|
| 7,171,321 B2* | 1/2007 | Best | 702/106 |
| 7,349,269 B2* | 3/2008 | Schaefer | 365/193 |
| 7,472,304 B2 | 12/2008 | Malekkhosravi et al. | |
| 7,590,008 B1 | 9/2009 | Roge et al. | |
| 7,755,955 B2* | 7/2010 | Seo | 365/194 |
| 7,957,210 B2 | 6/2011 | Yamazaki | |
| 2010/0299644 A1 | 11/2010 | Kawai | |

* cited by examiner

*Primary Examiner* — Tan T. Nguyen
(74) *Attorney, Agent, or Firm* — Erik A. Heter; Meyertons, Hood, Kivlin, Kowert & Goetzel, P.C.

(57) ABSTRACT

A method and apparatus for training a DLL in a memory subsystem is disclosed. In one embodiment, a memory subsystem includes a memory coupled to convey data read therefrom on one or more channels. Each memory channel may include a delay locked loop (DLL) configured to apply a desired amount of delay to a data strobe signal received from the memory during a read operation. Upon detecting a read request, a controller may initiate a training procedure in which the DLL is trained to the desired delay. During the training procedure, an input clock signal may be provided to the DLL. The delay within the DLL may be adjusted until an output clock signal has a desired phase relationship with the input clock signal. Once the desired phase relationship is attained, the training procedure may be terminated and the DLL input may be switched to receive the data strobe signal.

25 Claims, 5 Drawing Sheets

METHOD AND APPARATUS FOR TRAINING A DLL IN A MEMORY SUBSYSTEM

BACKGROUND

1. Technical Field

This disclosure relates to electronic circuits, and more particularly, the synchronization of operations in memory circuits.

2. Description of the Related Art

Double data rate (DDR) memories have been implemented in computers and other electronic systems over the past decade to increase memory throughput and thus overall system performance. Whereas single data rate (SDR) utilize only a single edge of a clock signal (e.g., the rising edge), a DDR memory utilizes both the rising and falling edges of the clock signal. Accordingly, a DDR memory operating at a given clock frequency may have a throughput that is twice that of an SDR memory operating at the same frequency.

When data is read from a DDR memory, the data ('DQ') may be returned with a data strobe signal ('DQS') that may be used to indicate the byte boundaries. The DQ signals may be synchronized with the DQS signal when provided by the memory. At the receiving device, the DQS signal may be delayed, with the delay DQS signal being used to capture the incoming DQ signals.

In some DDR memory embodiments, concurrent reads of the memory from multiple channels may be performed. Each channel may include a DLL that is used to delay the DQS signal for that channel. The channel-specific DLL's may be referred to as slave DLL's. An additional master DLL may also be used to determine the amount of delay to be applied to the DQS signal. Indications of the amount of delay determined by the master DLL may be applied to each of the slave DLLs. Each slave DLL may be designed to certain specifications such that the characteristics of each slave DLL are as closely matched to one another as possible. Accordingly, when receiving indications of the amount of delay determined by the master DLL, each slave DLL may apply substantially the same amount of delay. Such an arrangement may allow substantially synchronous transfer of data from a DDR memory on multiple channels.

SUMMARY

A method and apparatus for training a DLL in a memory subsystem is disclosed. In one embodiment, a memory subsystem includes a memory coupled to convey data read therefrom on one or more channels. Each memory channel may include a delay locked loop (DLL) configured to apply a desired amount of delay to a data strobe signal received from the memory during a read operation. Upon detecting a read request, a controller may initiate a training procedure in which the DLL is trained to the desired delay. During the training procedure, an input clock signal may be provided to the DLL. The delay within the DLL may be adjusted until an output clock signal has a desired phase relationship with the input clock signal. Once the desired phase relationship is attained, the training procedure may be terminated. Upon termination of the training procedure, the DLL input may be switched to receive the data strobe signal.

In one embodiment, an integrated circuit (IC) includes a memory controller and a double data rate (DDR) flash memory. The flash memory is coupled to the memory controller via a number of memory channels, wherein each of the memory channels includes a respective DLL. Responsive to detecting a read request, the memory controller may initiate a training procedure for respective DLLs of one or more of the memory channels. For a given DLL, the training procedure may be initiated by switching its input to receive an input clock signal that has a frequency that is twice that of the data strobe signal provided by the flash memory during read operations. During the training procedure, a phase difference between an output clock signal (provided by the given DLL) and the input clock signal may be determined. The delay provided by the DLL may be adjusted until the output clock signal has a phase difference of approximately 180° with the input clock signal. Upon attaining the 180° phase difference, the training procedure may be terminated. When the training procedure is terminated, the input of the given DLL may be switched to receive the data strobe signal from the flash memory. The output data strobe provided by the given DLL may be delayed by ¼ cycle, or 90° relative to the data strobe signal received at its input.

BRIEF DESCRIPTION OF THE DRAWINGS

The following detailed description makes reference to the accompanying drawings, which are now briefly described.

Figure 1:
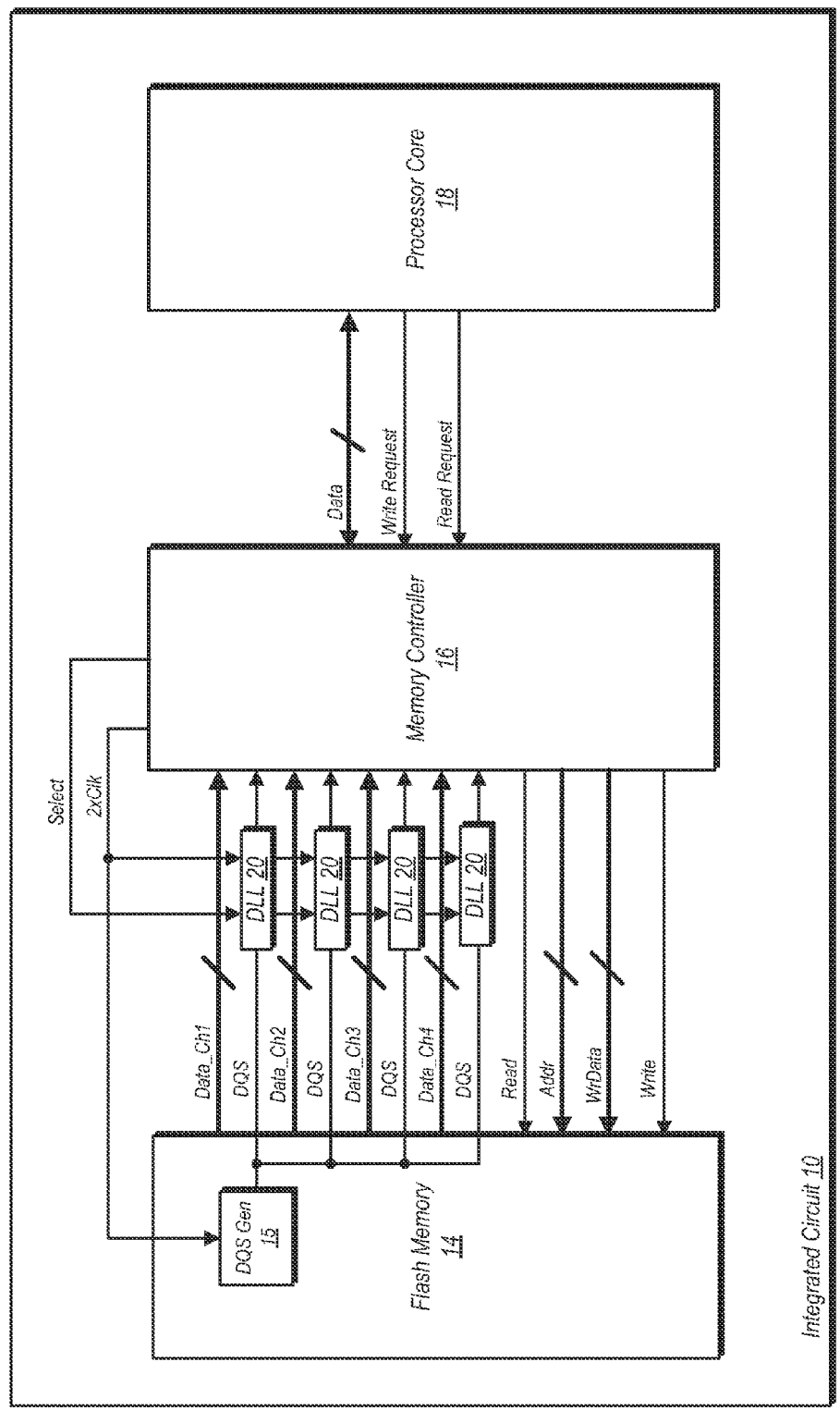
FIG. 1 is a block diagram of one embodiment of an integrated circuit (IC) having a memory subsystem.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

Integrated Circuit with Memory Subsystem:

Turning now to FIG. 1, a block diagram of one embodiment of an integrated circuit (IC) 10 is shown. In the embodiment shown, IC 10 includes a flash memory 10, a memory controller 16, and a processor core 18. Other functional blocks not explicitly shown here (e.g., additional processor cores, a random access memory, etc.) may also be included in various embodiments of IC 10.

In the embodiment shown, memory controller 16 is coupled to perform writes to and reads from flash memory 14. Memory controller 16 may assert the Write signal in order to initiate a write to flash memory 14. The data to be written may be conveyed over the write data ('WrData') signal lines, while the write address may be conveyed over address signal lines ('Addr'). Although not explicitly shown here, flash memory 14 may include multiple write channels or write ports.

Processor core 18 in the embodiment shown may be configured to receive data from and write data to flash memory 14 through memory controller 16. In the embodiment shown, processor core 18 may assert a write request signal to memory controller 16 in order to convey data to be written flash memory 14. In order to receive data from flash memory 14, processor core 18 may assert a read request signal to memory controller 16. A number of data lines ('Data') may convey data to be written to or read from flash memory 14 between processor core 18 and memory controller 16. In addition to processor core 16, other agents (e.g., other processor cores, graphics control units, interface units) may be coupled to convey read and write requests to memory controller 16. Corresponding data lines for conveying data between memory controller 16 and the additional agents may also be included.

Data may be read from flash memory 14 via a number of different read channels. For example, data may be conveyed over a first read channel via the signal lines labeled 'Data Ch1', data from channel 2 over the signal lines labeled 'Data Ch2', and so forth. In the embodiment shown, there are four distinct channels for conveying read data from flash memory 14 to memory controller 16. However, the number of channels may vary from one embodiment to another, and may be as few as one.

Each channel in the embodiment shown includes a corresponding delay lock loop (DLL) 20. The DLL 20 in each channel is coupled to receive a date strobe signal ('DQS) from a data strobe generator 15 of flash memory 14. The data strobe signal conveyed by flash memory may be used to indicate data boundaries in the data transmitted over the various channels. Each DLL 20 may provide a specified amount of delay to the respectively received data strobe signal. Delaying the data strobe signal may ensure that data received by memory controller 16 is correctly sampled.

Since the delay provided by each DLL 20 may vary due various factors such as voltage and temperature, training may be required. In the embodiment shown, each DLL 20 may undergo a training procedure at various times during operation. More particularly, training may be conducted in the embodiment shown responsive to a read request during a latency period between initiation of the request and the receipt of data by memory controller 16. In the embodiment shown, memory controller 16 is coupled to provide a input clock signal (2xClk) and a select signal ('Select') to each DLL 20. IN one embodiment, the input clock signal may have a frequency that is twice that of the data strobe signal provided by flash memory 14 during read operations. The select signal, when asserted, may cause a DLL 20 to select the input clock signal as its input instead of the data strobe signal. The training procedure may then be conducted using the input clock signal.

During the training procedure, the delay provided by each DLL 20 may be adjusted until reaching a desired amount. The amount of delay present in a given DLL 20 at any given time may be determined based on a phase detector included therein. Thus, the reaching the desired amount of delay may be determined when the phase detector detects a desired phase relationship between a respectively received input clock signal and a respectively provided output clock signal. In one embodiment, the phase detector for each DLL may determine that the desired amount of delay is present when the output clock signal is 180° out of phase with the input clock signal. Once the desired amount of delay has resulted in the correspondingly desired phase relationship, the training procedure may be terminated for that DLL.

Upon termination of the training procedure, the input to a given DLL may be switched to receive an input data strobe signal from flash memory 14. As noted above, in one embodiment the input data strobe may have a frequency that is one half that of the input clock signal used during training. If the desired delay results in a phase difference of 180° during the training procedure for such an embodiment, then the output data strobe provided by a given DLL will be delayed by ¼ of a cycle, or 90°, relative to the input data strobe. Delaying the output data strobe provided to memory controller 16 may allow sufficient time for received data to settle before being sampled.

The arrangement illustrated in FIG. 1 may provide certain advantages over various prior art embodiments. For example, some prior art embodiments utilize a master DLL to set the delay for a number of slave DLL's (each associated with one of the channels) during training. In the embodiment shown in FIG. 1, no master DLL is required. Furthermore, in an embodiment in which a master DLL and a number of slave DLLs are implemented, the slave DLL's may be subject to stricter design requirements such that characteristics of each DLL are as closely matched as possible to the other DLLs. However, in the embodiment shown in FIG. 1, the delay for each DLL 20 may be set independently of the others. Accordingly, it is not necessary that the characteristics of one DLL 20 closely match those of another DLL 20. This in turn may result in more design flexibility in such a memory subsystem.

It is noted that while the discussion above has been directed to an embodiment of an IC including a flash memory, the disclosure is not so limited. In contrast, the methodology discussed herein may be performed for memory types other than flash memory, including various types of random access memory and any other type of memory in which such training may be useful.

Figure 2:
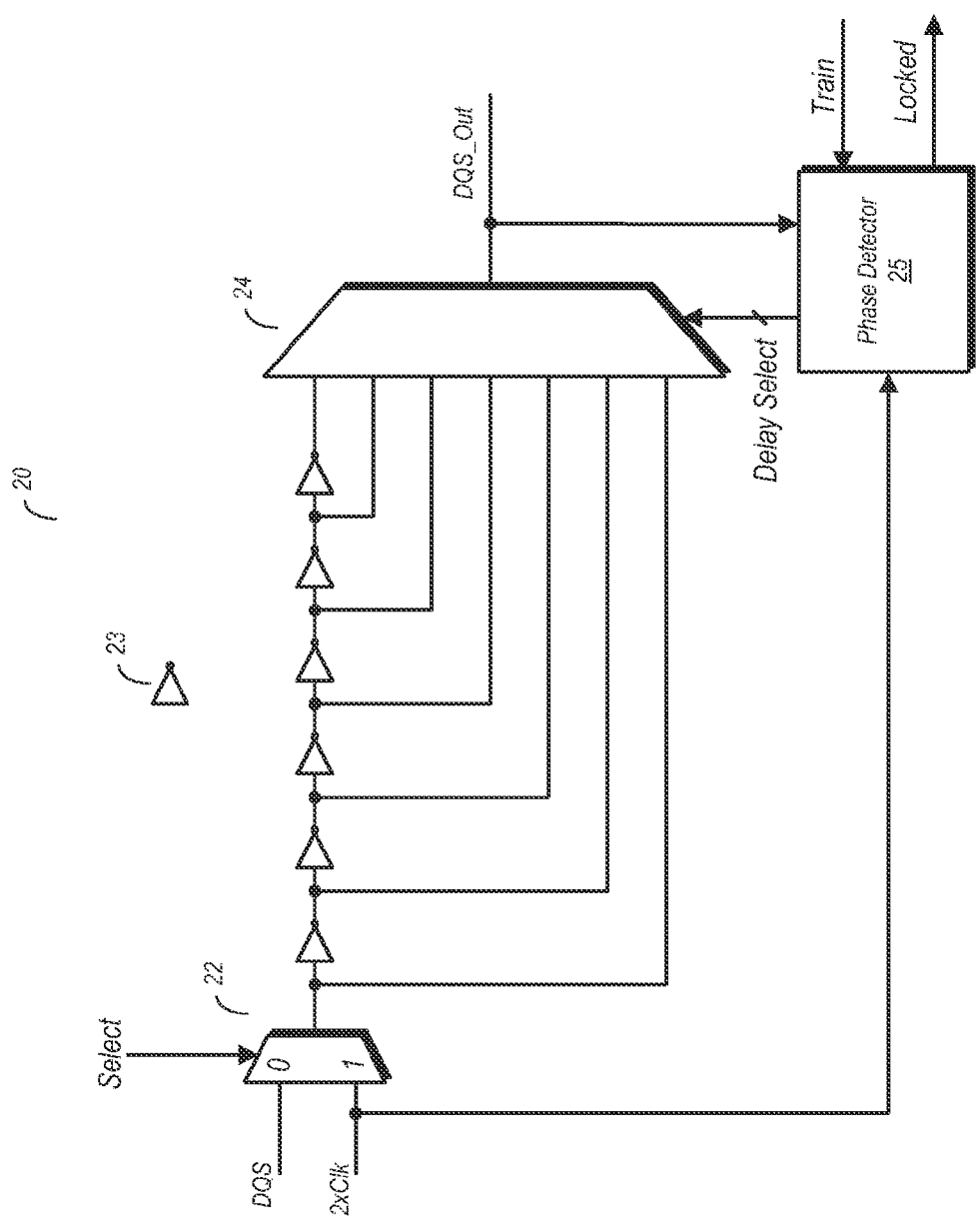
FIG. 2 is a logic diagram illustrating one embodiment of a delay locked loop (DLL).

Exemplary DLL:

FIG. 2 is a diagram illustrating one embodiment of a DLL 20 that may be implemented in various embodiments of a memory subsystem, such as that discussed above with regard to FIG. 1. In the embodiment shown, DLL 20 includes an input multiplexer 22, a number of serially coupled delay elements 23, an output multiplexer 24, and a phase detector 25. With respect to the delay elements 23, it is noted that the particular number present may vary from one embodiment to the next. Furthermore, while delay elements 23 shown in FIG. 2 are implemented as inverters, embodiments in which the delay elements are implemented as non-inverting buffers are also possible and contemplated.

In the embodiment shown, input multiplexer 22 is coupled to receive a data strobe signal ('DQS') and the input clock signal ('2xClk') used for training purposes. During normal operations (e.g., during reads or other times in which the memory is not being accessed), the select signal may be de-asserted. When the select signal is de-asserted, the data strobe is selected as the input to the chain of delay elements 23. The select signal may be asserted during training of DLL 20. When the select signal is asserted, the input clock signal, 2xClk, is provided as the input to the chain of delay elements 23.

Output multiplexer 24 of DLL 20 is configured to select an output tapped off of one of the delay elements 23 or multiplexer 22, based on a state of the delay select signals ('Delay Select'). The selected output may be conveyed as the output data strobe ('DQS_Out', to be provided to memory controller 16) during normal operations, or the output clock signal during training. The output of multiplexer 24 is also provided to a phase detector 25. Phase detector 25 is also coupled to receive the input clock signal. During training, phase detector 25 may detect a phase difference between the output clock signal and the input clock signal. Responsive to the phase difference detected, phase detector 25 may change the state of one or more of the delay select signals in order to select one of the tap points to be provided as its output. Furthermore, during training, phase detector 25 may further be configured to continue adjusting the states of the delay select signals until the output clock signal has a specified phase relation to the input clock signal. The delay may be specified by software, firmware, fuses, or any other suitable method. In one embodiment, the phase detector may continue adjusting the states of the delay select signals until the output clock signal is 180° out of phase with the input clock signal. Upon achieving the specified phase relationship (and thus the desired delay), the training of a given DLL 20 may be terminated.

In the embodiment shown, phase detector 25 may be activated for training responsive to receiving the training signal ('Train'), which may be provided by memory controller 16. In some embodiments, the read signal provided by memory controller 16 to flash memory 14 may double as the training signal. When, during training, phase detector 25 detects that the phase relationship between the input and output clock signals is as specified (and thus the desired delay is present), an indication of the same ('Locked') may be asserted and received by memory controller 16. Upon terminating training and asserting the 'Locked' signal, phase detector 25 may discontinue adjustments of the delay select signals until the next time the training signal is asserted. Responsive to receiving the 'Locked' signal, memory controller 16 may de-assert the select signal, thereby causing multiplexer 22 to select the data strobe signal as the input to be conveyed into the chain of delay elements 23. The output data strobe signal provided by DLL 20 may then be delayed by a specified amount based on the results of the training In one embodiment, the output data strobe signal may be delayed by 90° relative to the input data signal. It is noted however the embodiments utilizing other amounts of delay are possible and contemplated.

Figure 3:
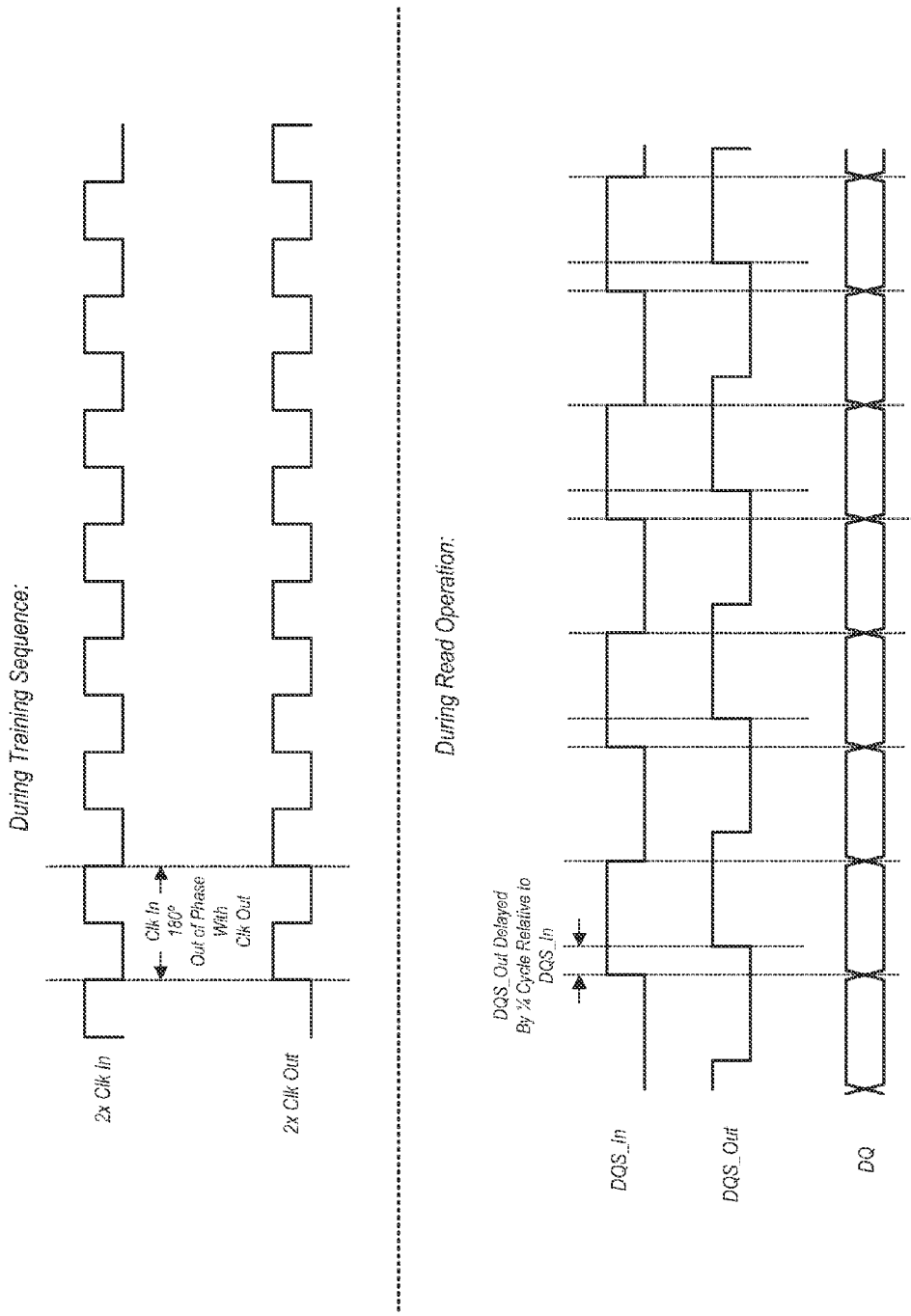
FIG. 3 is a timing diagram illustrating the relative timing of signals during the training procedure and during data transfer operations subsequent to the training procedure for one embodiment of a memory subsystem.

Timing Diagrams and Method Flowchart:

FIG. 3 is a timing diagram illustrating the training sequence and the results thereof on operation during a read for one embodiment of a memory subsystem. In the example shown, the training sequence may be conducted in order to achieve a 180° phase difference between the input clock signal, 2xClkIn, and the output clock signal, 2xClkOut. In the embodiment of DLL 20 shown in FIG. 2, this phase difference may be achieved by iteratively changing the selected tap points (e.g., the outputs of the delay elements 23, with one tap from the output of multiplexer 22) until the desired phase difference is achieved. Changing the selected tap points may thus change the amount of delay applied to the input clock signal in order to produce the output clock signal. Once the desired phase relationship (and thus the desired delay) has been attained, the training procedure may be terminated.

In the illustrated example, the clock signal used for training the DLL 20 has a frequency that is twice that of the data strobe signal. Delaying output clock signal by 180° during the training sequence thus results in the output data strobe (DQS_Out) signal being delayed by 90° (or ¼ of a cycle) relative to the input data strobe signal. The data signals ('DQ') may be aligned with the edges of the input data strobe signal. Accordingly, by delaying the output data strobe signal ¼ cycle, memory controller 16 may thus sample the data signals after they have transitioned and have been allowed sufficient time to settle. This may guarantee correct data capture by memory controller 16 (or more generally, any unit receiving both the output data strobe signal and the data from the memory.

Figure 4:
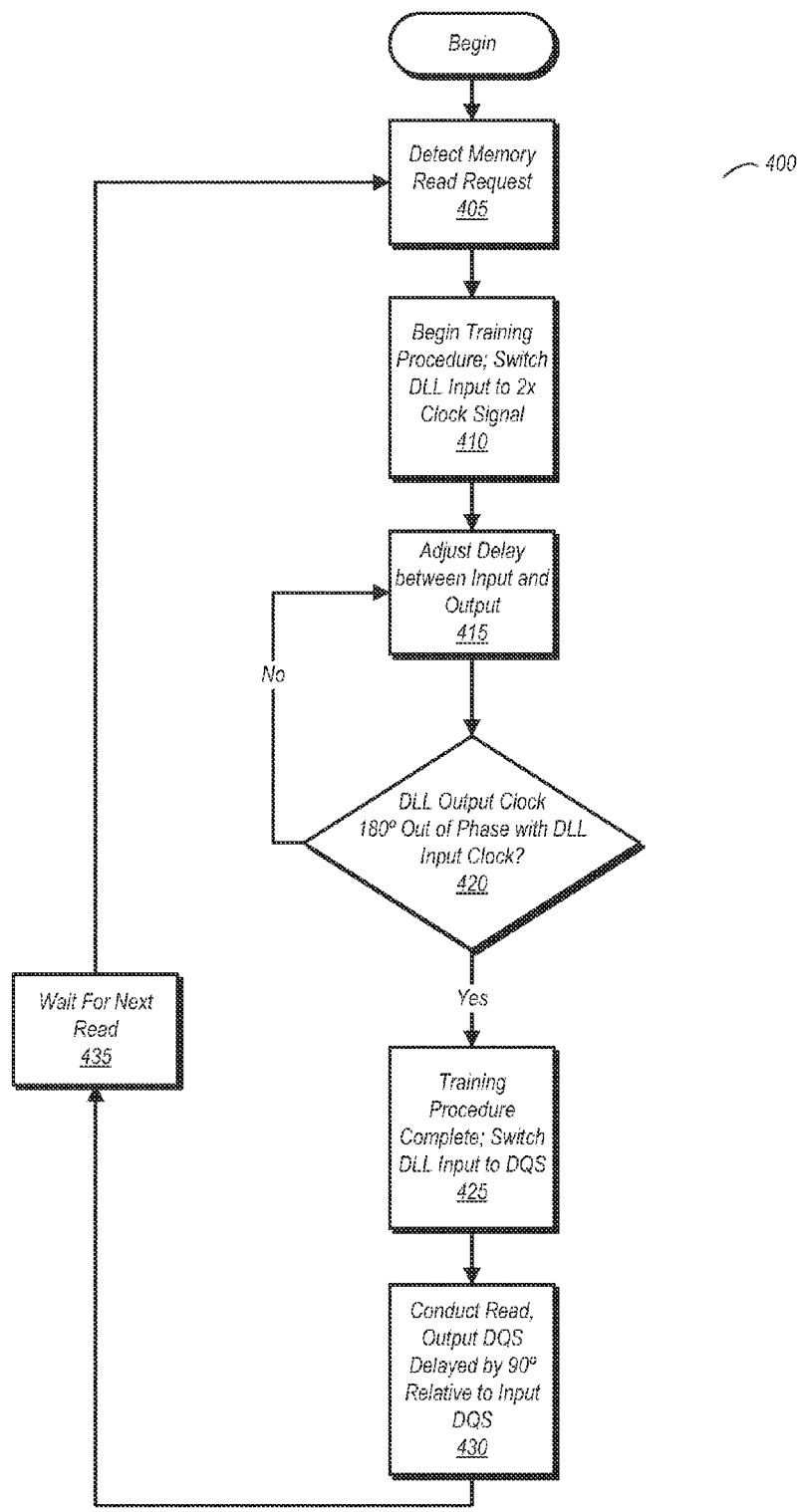
FIG. 4 is a flow diagram of one embodiment of a method for conducting a training procedure during a memory read latency period.

Turning now to FIG. 4, a flow diagram illustrating one embodiment of a method for training a DLL in a memory channel is shown. Method 400 may be utilized with the various hardware embodiments discussed above. In addition, method 400 may also be utilized with other embodiments not explicitly discussed herein.

Method 400 begins with the detecting of a memory read request (block 405). Responsive to detecting the memory read request, a training procedure may be initiated (block 410). The training procedure may include switching an input of the DLL to be trained such that it receives an input clock signal. In this particular example, the input clock signal may have a frequency that is twice that of the data strobe signal conveyed from the memory. During the training procedure, the delay between the input and output of the DLL may be adjusted (block 415). If, in the embodiment shown, the phase difference between the output clock signal and the input clock signal is not approximately 180° (block 420, no), then adjustments of the delay may continue at block 415.

If the phase difference between the output clock signal and the input clock signal is approximately 180° (block 420, yes), then the training procedure is complete and the input of the DLL is switched to receive the data strobe signal from the memory (block 425). In various embodiments, the entirety of the training procedure may occur in the latency period between the time the read request is asserted and the time that data is returned from the memory.

Subsequent to completion of the training procedure, the read of data over the channel that includes the DLL may occur (block 430). In this particular embodiment, the output data strobe signal provided by the DLL may be delayed by 90° relative to the data strobe signal conveyed from the memory. After the read operation is complete, the method may wait for the next read (block 435).

Figure 5:
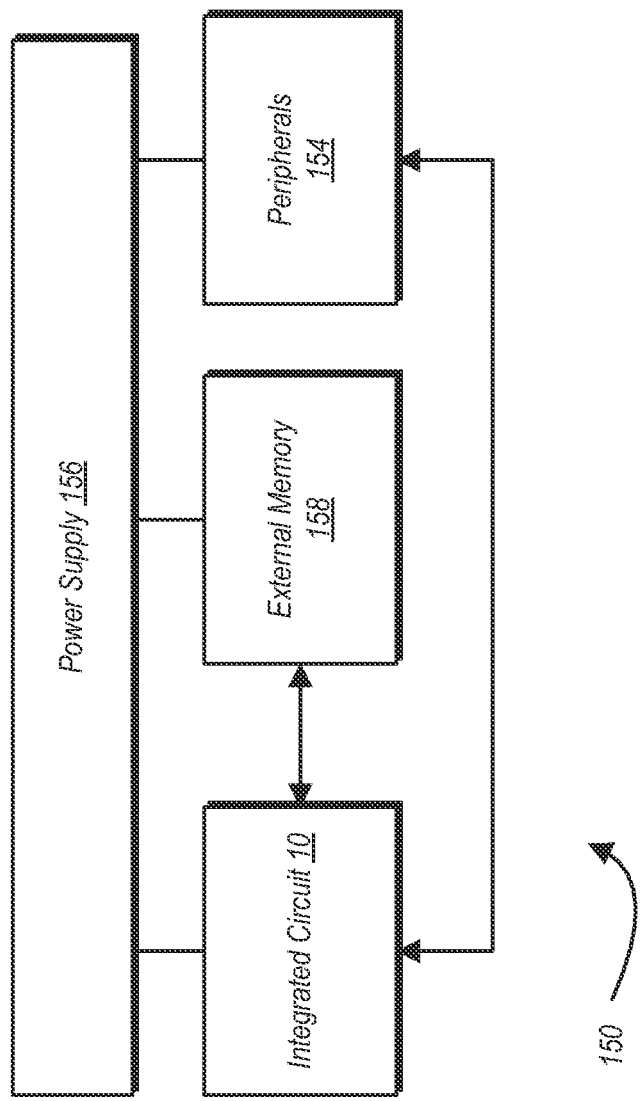
FIG. 5 is a block diagram of one embodiment of a system.

Exemplary System:

Turning next to FIG. 5, a block diagram of one embodiment of a system 150 is shown. In the illustrated embodiment, the system 150 includes at least one instance of an IC 10 (e.g., from FIG. 1) coupled to one or more peripherals 154 and an external memory 158. A power supply 156 is also provided which supplies the supply voltages to the IC 10 as well as one or more supply voltages to the memory 158 and/or the peripherals 154. In some embodiments, more than one instance of the IC 10 may be included (and more than one external memory 158 may be included as well).

The peripherals 154 may include any desired circuitry, depending on the type of system 150. For example, in one embodiment, the system 150 may be a mobile device (e.g. tablet computer, smart phone, etc.) and the peripherals 154 may include devices for various types of wireless communication, such as wifi, Bluetooth, cellular, global positioning system, etc. The peripherals 154 may also include additional storage, including RAM storage, solid-state storage, or disk storage. Additionally, the peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, net top etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, Flash, etc. In some embodiments, external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. An system comprising:
  a memory;
  at least one requestor configured to read data from the memory;
  a delay locked loop (DLL) coupled to receive an input data strobe signal from the memory and configured to provide an output data strobe signal to the at least one requestor, wherein the output data strobe signal is a delayed version of the input data strobe; and
  a controller configured to initiate a training procedure responsive to the requestor initiating a read request from the memory, wherein the training procedure comprises determining an amount of delay to be provided by the DLL in order to cause the output data strobe to be delayed by a specified amount with respect to the input data strobe.

2. The system as recited in claim 1, wherein the DLL includes a selection circuit having a first input coupled to receive the input data strobe, and a second input coupled to receive a clock signal having a frequency that is twice that of the input data strobe.

3. The system as recited in claim 2, wherein the controller is configured to cause the DLL to, during the training procedure, provide an output signal that is 180 degrees out of phase with the clock signal.

4. The system as recited in claim 3, wherein the DLL is configured to, subsequent to training, provide the output data strobe signal at a delay of 90 degrees with respect to the input data strobe signal.

5. The system as recited in claim 1, wherein the memory is a flash memory.

6. A method comprising:
  detecting a read request being transmitted to memory;
  initiating training of a delay locked loop (DLL) responsive to detecting the read request, wherein said training comprises causing the DLL to lock to a delay to provide an output signal that is a out of phase with an input clock signal by a first specified delay; and
  subsequent to said training, providing, from the DLL, an output data strobe signal to a functional unit that initiated the request, wherein the output data strobe signal lags an input data strobe signal by second specified delay.

7. The method as recited in claim 6, further comprising a selection circuit of the DLL selecting the input clock signal during said training, wherein the input clock signal has a frequency that is twice that of both the input and output data strobe signals, and wherein the first specified delay is 180 degrees out of phase and wherein the second specified delay is lagging by 90 degrees.

8. The method as recited in claim 7, further comprising the selection circuit selecting the input data strobe signal subsequent to said training.

9. The method as recited in claim 6, further comprising terminating said training prior to the functional unit receiving data from the memory.

10. The method as recited in claim 9, further comprising the functional unit capturing the data received from memory using the output data strobe subsequent to said training.

11. A memory subsystem comprising:
  a memory;
  a functional unit;
  a plurality of memory channels coupled to convey data from the memory, wherein each of the memory channels includes a respective delay locked loop (DLL) coupled to receive a corresponding first data strobe signal provide by the memory and is configured to provide a corresponding second data strobe signal to the functional unit; and
  a control unit, wherein responsive to one or more read requests initiated by the functional unit, the control unit is configured to initiate training of respective DLLs for each memory channel to be used to convey data from the memory to the functional unit, wherein said training comprises causing each of the respective DLLs to select a respective amount of delay such that a respective output signal that is 180 degrees out of phase with a received input clock signal.

12. The memory subsystem as recited in claim 11, wherein a respective DLL for each of the plurality of memory channels is configured to be trained independently of the respective DLLs of other ones of the plurality of memory channels.

13. The memory subsystem as recited in claim 11, wherein a frequency of the input clock signal is twice a frequency of the first data strobe signal received by each respective DLL of the plurality of memory channels.

14. The memory subsystem as recited in claim 13, wherein, subsequent to training, the corresponding second data strobe output by each DLL is delayed by 90 degrees with respect to the first data strobe received by each DLL.

15. The memory subsystem as recited in claim 11, wherein the memory is a flash memory, and wherein the control unit is configured to cause training of the respective DLLs for each memory channel used to convey data from the memory during a latency period between initiation of a read request and a return of data from the memory resulting from the read request.

16. A method comprising:
  invoking a read request to a memory configured to provide data on a first memory channel and a second memory channel;
  initiating a training procedure for a first delay locked loop (DLL) in the first memory channel and a second DLL in the second memory channel, wherein the training procedure comprises:
    providing an input clock signal to each of the first and second DLLs;

selecting a first amount of delay in the first DLL such that a first output clock signal provided by the first DLL is 180 degrees out of phase with the input clock signal; and selecting a second amount of delay in the second DLL such that a second output clock signal provided by the second DLL is 180 degrees out of phase with the input clock signal;

providing an input data strobe signal to each of the first and second DLLs, wherein the input data strobe signal has a frequency that is one half a frequency of the input clock signal; and providing first and second output data strobe signals from the first and second DLLs, respectively, wherein the first and second output data strobe signals lag the input data strobe signal by 90 degrees.

17. The method as recited in claim 16, further comprising performing the training during a latency period between a time when the read request is invoked and a time when data requested in the read request is returned from the memory.

18. The method as recited in claim 16, further comprising the first DLL selecting the first amount of delay independent of the second DLL selecting the second amount of delay.

19. The method as recited in claim 16, further comprising:
capturing data transmitted on the first channel using the first output data strobe signal; and
capturing data transmitted on the second channel using the second output data strobe signal.

20. The method as recited in claim 16, further comprising repeating the training procedure responsive to each subsequent read request.

21. An integrated circuit comprising:
a flash memory;
a memory controller coupled to the flash memory; and
a first delay locked loop (DLL) associated with a first memory channel coupled to convey data from the flash memory to the memory controller;
wherein the memory controller is configured to, responsive to a read request, initiate a training procedure of the first DLL associated with the first memory channel, wherein the first DLL is configured to determine a first amount of delay to provide such that a first output data strobe provided by the first DLL has a specified phase lag with respect to an input data strobe; and
wherein the memory controller is configured to terminate the training procedure subsequent to the DLL determining the first amount of delay.

22. The integrated circuit as recited in claim 21, wherein the memory controller is configured to initiate the training procedure by causing the first DLL to select, as an input, and input clock signal having a frequency that is double a frequency of the input data strobe.

23. The integrated circuit as recited in claim 22, wherein the first DLL is configured to, during the training procedure, determine an amount of delay required to provide an output clock that is 180 degrees out of phase with the input clock signal.

24. The integrated circuit as recited in claim 23, wherein the first DLL is further configured to, subsequent to the training procedure, provide the first output data strobe with a phase lag of 90 degrees with respect to the input data strobe.

25. The integrated circuit as recited in claim 21, wherein the memory controller is further configured to, responsive to the read request, initiate the training procedure for a second DLL associated with a second channel coupled to convey data between the flash memory and the memory controller, wherein the second DLL is configured to, during the training procedure, determine a second amount of delay to provide such that a second output data strobe provided by the second DLL has a specified phase lag with respect to the input data strobe.

* * * * *